United States Patent [19]
Allen et al.

[11] Patent Number: 6,107,199
[45] Date of Patent: Aug. 22, 2000

[54] METHOD FOR IMPROVING THE MORPHOLOGY OF REFRACTORY METAL THIN FILMS

[75] Inventors: Russell D. Allen, Mahopac; F. Read McFeely, Ossining; Cevdet I. Noyan, Yorktown Heights, all of N.Y.; John J. Yurkas, Stamford, Conn.

[73] Assignee: International Business Machines Corporation, Armonk, N.Y.

[21] Appl. No.: 09/178,342

[22] Filed: Oct. 24, 1998

[51] Int. Cl.[7] ...................................... H01L 21/44
[52] U.S. Cl. ........................ 438/685; 438/683; 438/643; 438/648; 438/656; 438/660; 438/680
[58] Field of Search .................... 438/683, 643, 438/648, 656, 660, 680, 685

[56] References Cited

U.S. PATENT DOCUMENTS

| | | | |
|---|---|---|---|
| 4,874,642 | 10/1989 | Garg et al. | 427/249 |
| 5,064,686 | 11/1991 | McGeary | 427/124 |
| 5,084,417 | 1/1992 | Joshi et al. | 437/192 |
| 5,277,987 | 1/1994 | Garg et al. | 428/457 |
| 5,286,520 | 2/1994 | Proscia | 427/109 |
| 5,317,190 | 5/1994 | Fleischman et al. | 257/743 |
| 5,358,899 | 10/1994 | Fleischman et al. | 437/184 |
| 5,807,788 | 9/1998 | Brodsky et al. | 438/653 |

*Primary Examiner*—John F. Niebling
*Assistant Examiner*—Lynne A. Gurley
*Attorney, Agent, or Firm*—Thomas A. Beck

[57] ABSTRACT

A method of producing a smooth surface for a film of refractory metallic material is realized by placing a substrate in a CVD reactor; initiating deposition of a layer of two phase material via concurrent introduction into the CVD reactor of a precursor gas and molecular oxygen, the latter at a pressure between about $1 \times 10^{-6}$ and $1 \times 10^{-4}$; and annealing the treated layer at the deposition temperature.

14 Claims, 6 Drawing Sheets

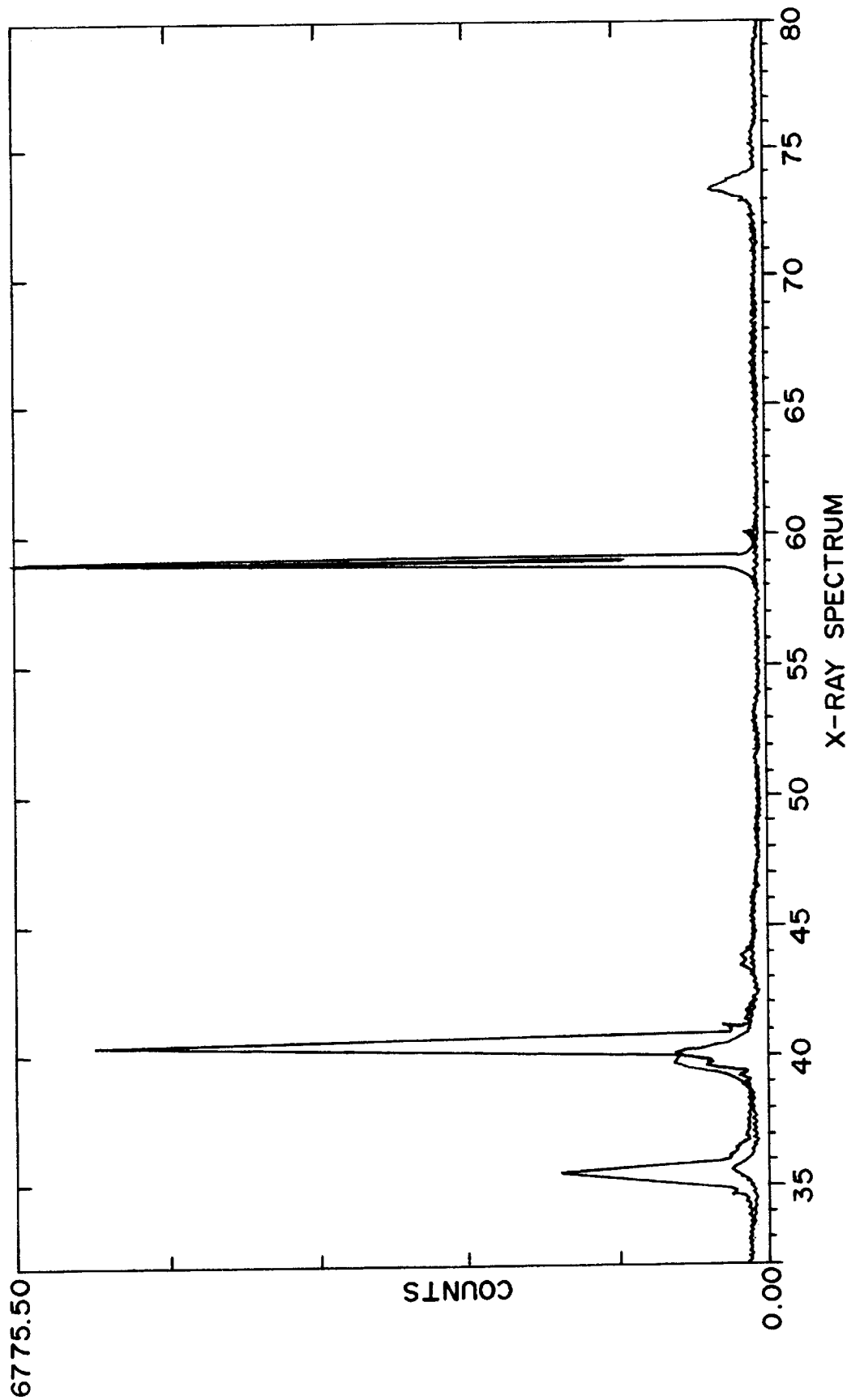

METHOD FOR IMPROVING THE MORPHOLOGY OF REFRACTORY METAL THIN FILMS

BACKGROUND OF THE INVENTION

1. Field of the Invention

The present invention relates to a method for improving the morphology of refractory metal thin films by utilizing a low temperature phase transition. The improved method involves modification of the standard methods for the deposition of refractory metal films. The improved method includes both chemical vapor deposition (CVD) and physical deposition methods, such as sputter deposition.

2. Brief Description of the Prior Art

Refractory metals are character by their high melting points, exceeding an arbitrary value of 2000° C., and low vapor pressures, two properties exploited by the electronics industry. Only four refractory metals, molybdenum, niobium, tantalum and tungsten, are available in quantities of industrial significance. Molybdenum, niobium, tantalum and tungsten have been produced commercially for many years, mainly as additives to steels, nickels and cobalt alloys and for certain electrical applications. In addition to high temperature strength, the relatively low thermal expansions and high thermal conductivities of the refractory metals suggest good resistance to thermal shock. There are however two characteristics, ready oxidation at high temperatures and, in the case of molybdenum and tungsten, brittleness at low temperatures, which limit their applications.

The metals to which the present invention applies comprises tantalum, niobium, molybdenum and tungsten.: Tantalum is a white lustrous metal resembling platinum. It is highly acid resistant and is classed as a noble metal. Tantalum will hold a fine cutting edge on tools. By adding silicon to tantalum, its hardness can be made close to diamond. Anode film made from tantalum has better dielectric properties than Al. It possesses a very low ductile-brittle transition temperature and a very versatile aqueous corrosion resistance. It can be effectively used in applications such as in electrodes in thermionic valves and capacitors. Corrosion resistant tantalum fabrications include thermocouple pockets, bayonet heaters, tube and sheet heat exchangers, electric lightbulb filaments, radio tubes operating at high temperatures, and current rectifiers.

Niobium also known as columbium is also called niobium possesses good corrosion resistance. It forms a superconducting alloy with tin. It has low neutron capture cross-section and very low ductile-brittle transition temperature, except when highly alloyed.

Molybdenum is typically used in electrodes in glass melting furnaces.

Tungsten is a heavy white metal which possesses the highest melting point of all metals. The metal is brittle and difficult to fabricate. Tungsten has a wide usage in alloy steels, magnets, heavy metals, electric contacts, light bulb filaments, rocket nozzles and especially electronic applications. Parts, rods, and sheet are made by powder metallurgy using tungsten powder of 99.99% purity, and rolling and forging are performed at high temperatures. The rolled metal and drawn wire have exceptionally high strength and hardness. Tungsten wire for spark plug and wire electronic use is made by powder metallurgy. Tungsten whiskers are used in copper alloys to provide strength. The properties of tungsten make it especially important in electronic use.

Refractory metals are widely used for the fabrication of microelectronic circuitry where their ability to withstand high temples is required. Tungsten in particular is widely used in various wiring applications. Refractory metals ,may also be used as precursors to the formation of suicides for various applications.

Other objects and features as well as additional details of the present invention will become apparent from the following detailed description and annexed drawings of the presently preferred embodiments thereof, when considered in conjunction with the associated drawings.

SUMMARY OF THE INVENTION

The method of the present invention comprises the following steps: first, a suitable substrate is introduced into a CVD or sputter deposition chamber. The substrate is formed from any material that is compatible with the deposition of the desired metal film in the standard practice of metal deposition.

Second, the deposition of the desired metal, e.g. tungsten or tanatalum, is initiated. The metal utilized is any metal that possesses a metastable phase, the deposition of which may be stimulated by oxygen. The metastable phase may contain small amounts of oxygen, or may be pure metal. An example of such a suitable metastable phase is the beta phase of metallic tungsten. The thermodynamically stable bcc phase is referred to as the alpha phase.

Concurrent with the initiation of oxygen deposition, oxygen is controllably admitted into the deposition chamber, typically by means of a variable leak valve, so as to stimulate the deposition of a mixture of the metastable phase and the desired stable phase. An example of this combination is metastable tungsten in the beta phase in a matrix of the stable alpha tungsten. Low concentrations and partial pressures of oxygen or other oxidizing gas are preferred.

Third, the two-phase sample is then annealed at a temperature less than or equal to the normal CVD deposition temperature, which is typically 500° C.; although, as indicated hereinafter, some successful annealing at 80° C. has been demonstrated for the case of tungsten. The annealing step serves to transform the 2-phase sample to a single phase and produce a film with substantially reduced surface roughness and altered grain structure. Annealing temperatures near the melting point of the refractory metal would normally be required to provide sufficient atomic mobility to alter the morphology of the film. The high temperatures that would be required, i.e., in excess of 2000° C., would severely limit the choice of substrate in the first step detailed above, making this approach impractical. It is believe that the stimulation of a phase transition from the single-phase material is the mechanism affording the atomic mobility necessary to effect the alteration of the morphology of the film.

The combination of steps described above produces films of superior smoothness.

Thus one method of the present invention produces a smooth surface for a film of refractory metallic material comprising placing a substrate in a CVD reactor; initiating deposition of a layer of two phase material via concurrent introduction into said CVD reactor of a precursor gas and molecular oxygen, the latter at a pressure between about $10^{-6}$ and $10^{-4}$ Torr; and then annealing said layer at the deposition temperature.

The alternate method of producing a smooth surface for a film of refractory metallic material comprises sputtering a refractory metal onto a substrate via the introduction of molecular oxygen at a pressure of between about $10^{-6}$ and $10^{-4}$ Torr to obtain a two-phase surface of refractory metal on said substrate; and then annealing said layer at temperature in the range of 80° C. or above.

BRIEF DESCRIPTION OF THE DRAWINGS

FIG. 5 depicts an x-ray diffraction spectra taken before and after the annealing of the sample depicted in FIG. 4.

DETAILED DESCRIPTION OF THE PREFERRED EMBODIMENT

The specific method of the present invention to achieve a smoother surface on the sample is defined as follows. A substrate onto which a refractory metal such as, metallic tungsten is to be deposited is introduced via a load lock as depicted in FIG. 7 into the deposition chamber. The material is typically silicon, silicon dioxide or silicon nitride, but may be any material provided it can withstand heating to 500° C. and does not react rapidly with the refractory metal chosen at that temperature.

The reactor is typically a stainless steel, cold wall, ultra-high vacuum system with a base pressure, better than $1\times10^{-6}$ Torr, preferably better than $1\times10^{-7}$ Torr, most preferably $1\times10^{-9}$. The low pressure of the system is desirable, in order that the oxygen partial pressure can be accurately and reproducibly controlled. The substrate is heated to the deposition temperature, which is typically 500° C., but may vary according to the substrate and the specific deposition method.

The precursor gas for CVD deposition, e.g., tungsten hexacarbonyl for tungsten deposition, is admitted to the reactor under flow conditions to a pressure of approximately $3\times10^{-3}$ Torr. While this process is described as using tungsten hexacarbonyl, any precursor gas suitable for the deposition of pure tungsten, or any other suitable pure refractory metal with the requisite metastable phase, as described above, may be used. By way of illustration, specifically for tungsten, CVD using tungsten hexafluoride as a precursor gas may be selected instead, although the oxygen partial pressure employed must be separately optimized to reflect the different kinetics of the process.

Concurrent with the admission of the precursor gas, oxygen is admitted to the reactor to give a partial pressure of $1\times10^{-5}$ Torr. The partial pressure of the oxygen must be controlled accurately. Insufficient oxygen has a negligible effect on the process, while excessive oxygen, i.e., typically, greater than about $1\times10^{-4}$ Torr results in the formation of tungsten oxides, not the desired beta-tungsten, causing the process to fail.

When the deposition is complete, the reactor is evacuated and the substrate is held at 500° C., the deposition temperature at which the sample is annealed and which effects transformation of the metastable phase. The substrate was then cooled and removed from the reactor.

Figure 1:
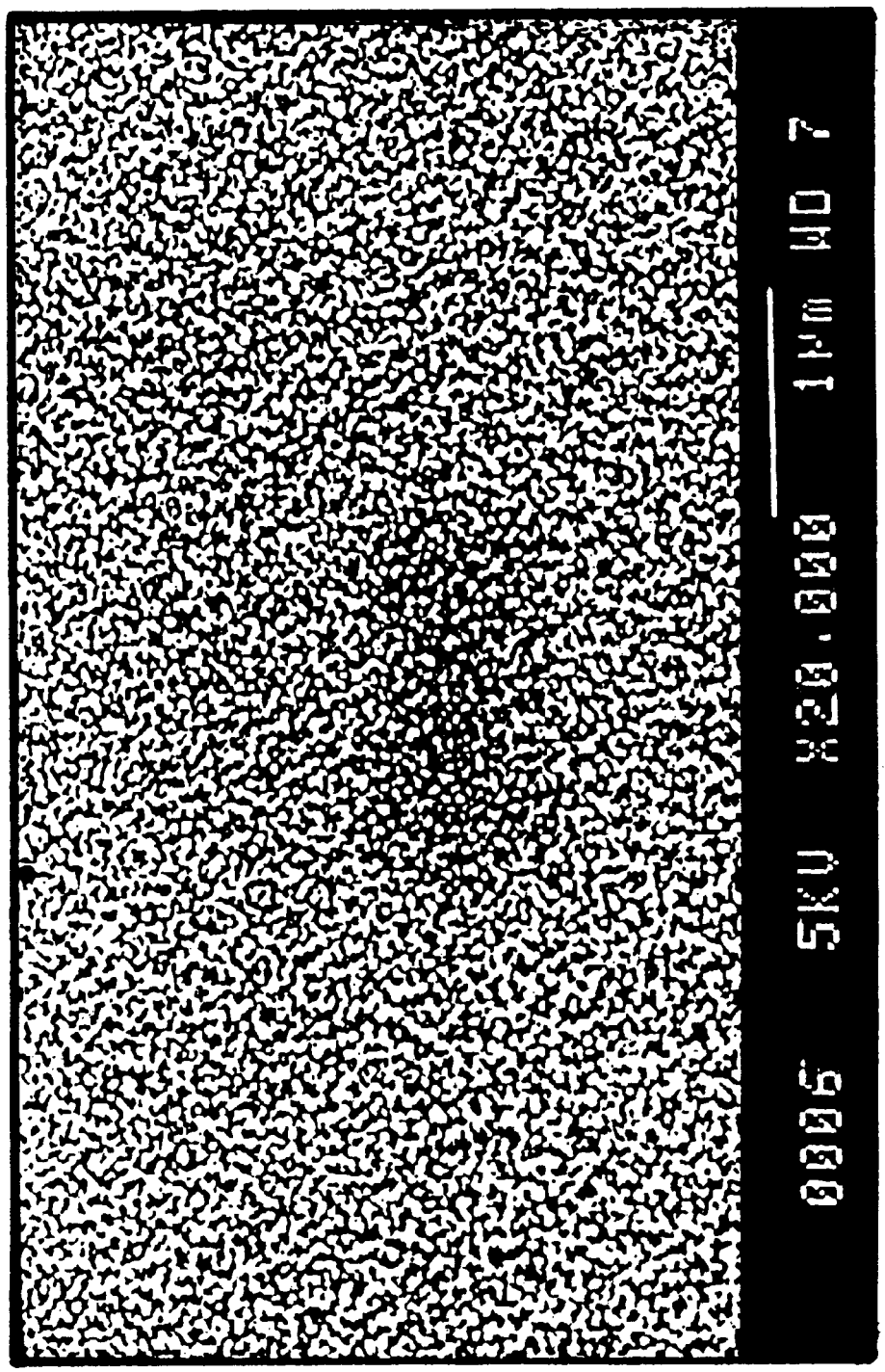
FIG. 1 depicts a magnified image of a tungsten film deposited via standard CVD as found in the prior art.

Referring to the drawings, FIG. 1 is an electron microscope (SEM) image showing the surface which results from the deposition of approximately 60 nm of tungsten on a polished Si substrate using the standard prior art procedure. The surface of the resulting product is grossly rough and granular.

Figure 2:
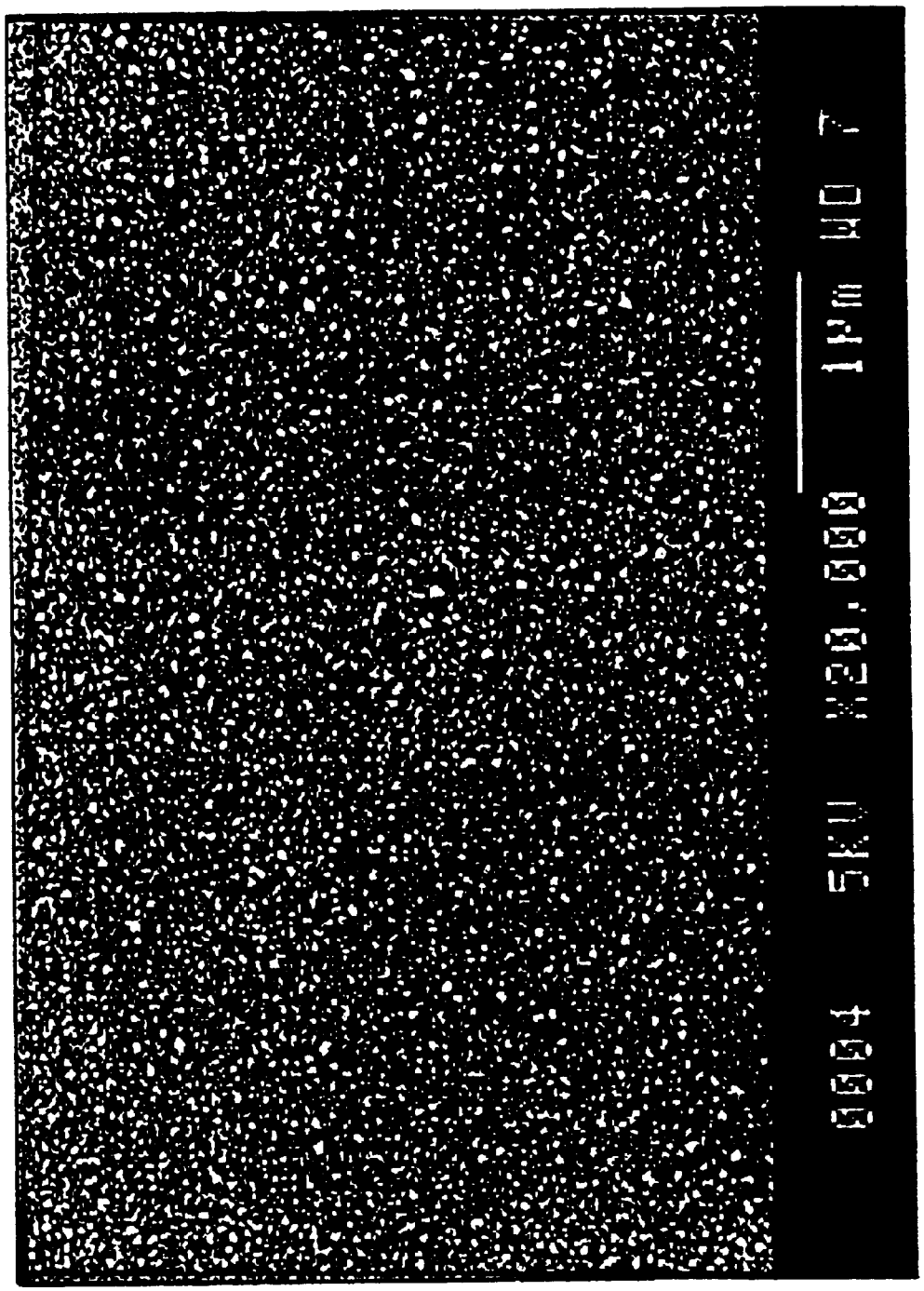
FIG. 2 depicts a magnified image of a tungsten film deposited via standard CVD according to the present invention.

The process of the present invention as described above was utilized to effect the deposition of approximately 60 nm of tungsten, e.g., a polished Si substrate and the SEM image of FIG. 2 depicts the results of such deposition. The surface depicted is clearly substantially smoother. Quantitative analysis of the rms surface roughness by atomic force microscopy over a typical two micron square region shows and almost two-fold reduction in roughness, from 3.2 nm to 1.8 nm.

The alternative process utilized to obtain the smooth surface film involves an implementation of the sputter deposition procedure. In accordance with the procedure, a polished Si substrate was introduced into a standard sputter deposition tool. Although this was a standard tool, it is emphasized that a low base pressure of oxygen in the tool is desirable in order to achieve the optimal control of the process.

Sputter deposition was initiated in the usual manner. Concurrent with the initiation of the deposition of the deposition, oxygen was admitted into the deposition chamber to a partial pressure of approximately $1\times10^{-6}$ Torr. The sample was removed then from the deposition tool and annealed for 5 hours at 80° C. to effect the beta-alpha transition.

Figure 3:
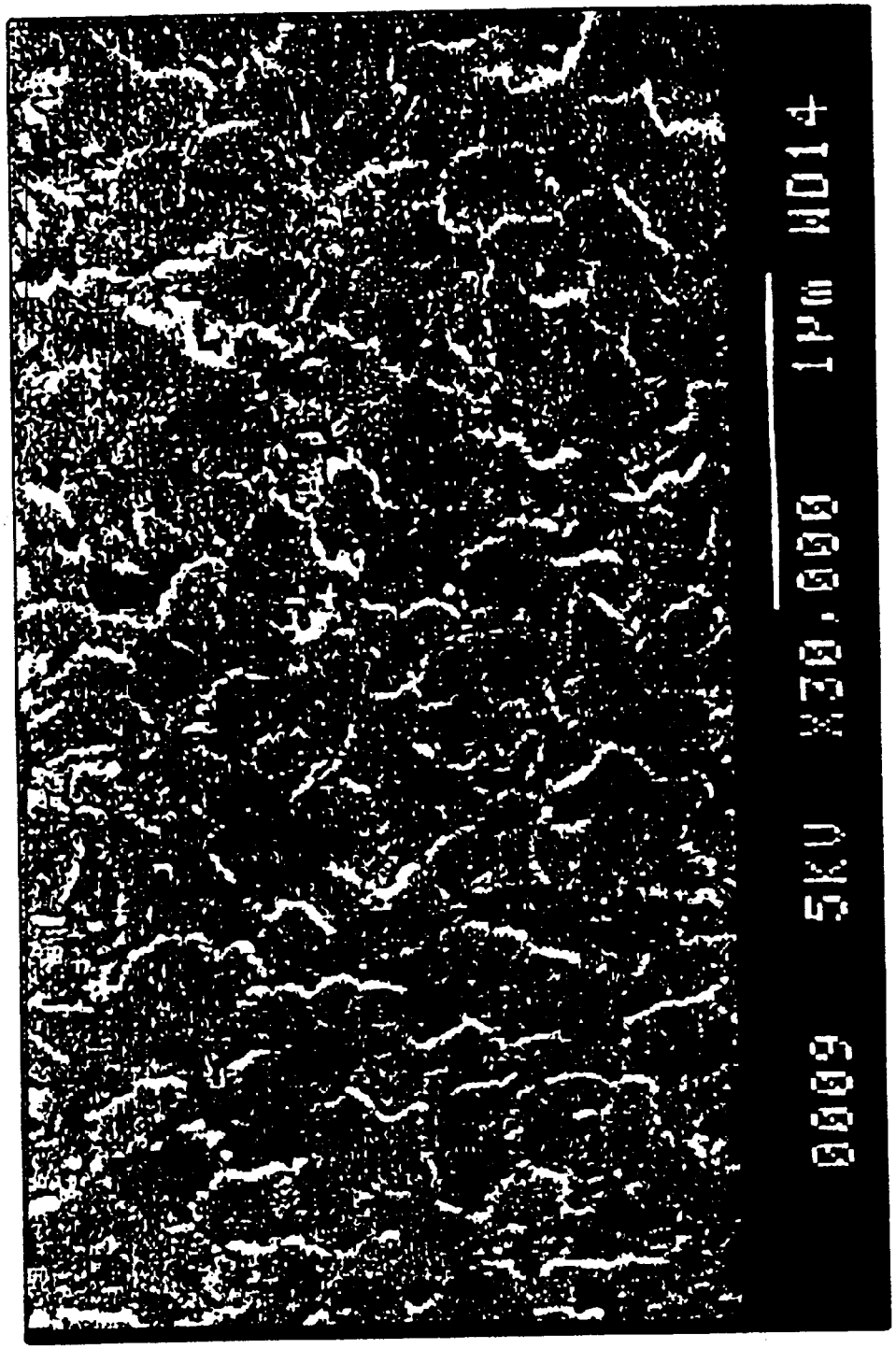
FIG. 3 depicts a more detailed magnified image of a tungsten film deposited via standard CVD as found in the prior art.

Referring to the drawings, FIG. 3 is an SEM image, which shows the surface of a film approximately 2.5 nm thick deposited according to typical prior art sputter deposition procedure. The roughness of the surface is apparent.

Figure 4:
FIG. 4 depicts a more detailed magnified image of a tungsten film deposited via standard CVD according to the present invention.

FIG. 4 is an SEM image showing the surface of a sample, approximately 2.5 nm thick deposited using the method of the present invention described immediately above. It is noted that the surface is extremely smooth by comparison. The raised area in the center of the image is a dust particle irrelevant to the effect obtained using the process.

FIG. 5 show x-ray diffraction spectra, taken before and after the annealing of the sample illustrated in SEM image shown in FIG. 4, and shows distinct changes in the 30–45 degree range, indicative of the transformation of beta tungsten into alpha tungsten. X-ray reflectivity measurements taken concurrently show that the surface roughness decreases as the transformation of beta tungsten into alpha tungsten progresses.

Figure 6A:
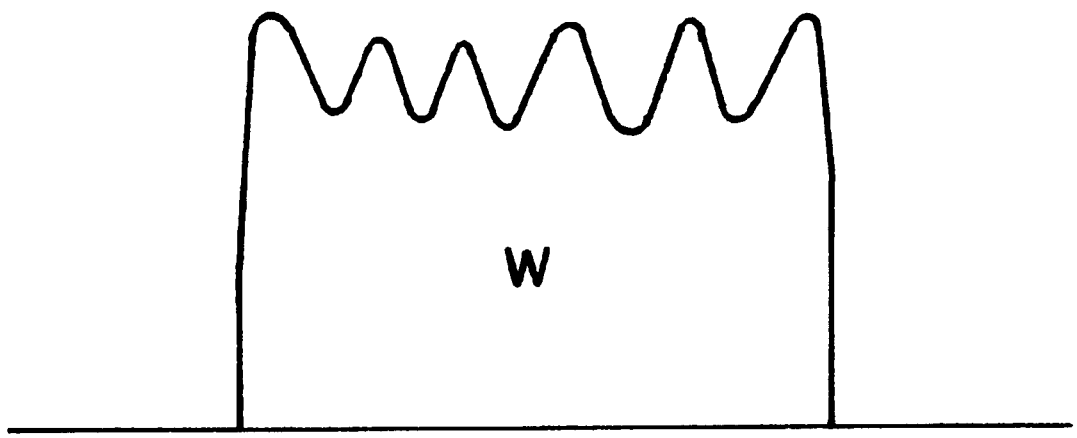
FIGS. 6A and 6B depict a side view of a refractory metal showing a comparison of the tungsten surfaces from the prior art (so indicated) and the present invention.
Figure 6B:
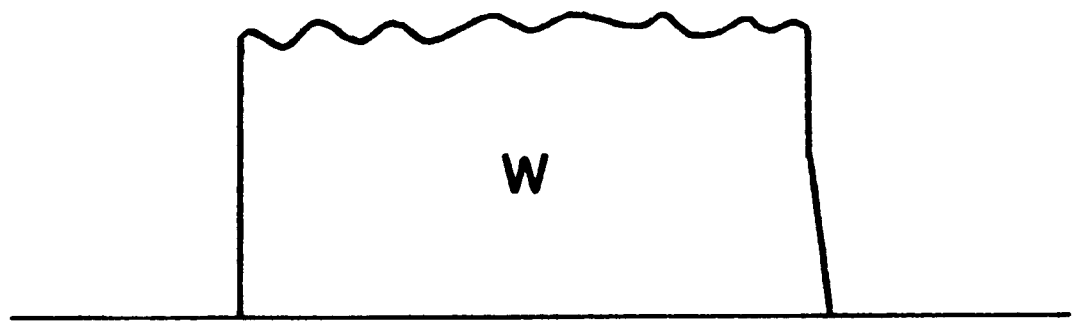

FIG. 6 illustrates a schematic comparison of the side view of the surface of a thin film that has been treated according tot he prior art an according to the present invention. FIG. 6A shows a rough surface resulting from the lack of oxygen in the system. FIG. 6B shows the smoother surface that results from the treatment performed in accordance with the present invention.

Thus, while there have been shown and described and pointed out fundamental novel features of the invention as applied to currently preferred embodiments thereof, it will be understood that various omissions and substitutions and changes in the form and details of the method and apparatus illustrated, and in their operation, may be made by those skilled in the art without departing from the spirit of the invention. In addition it is to be understood that the drawings are not necessarily drawn to scale but that they are merely conceptual in nature. It is the intention, therefore, to be limited only as indicated by the scope of the claims appended herewith.

Having thus described our invention, what we claim as new and desire to secure by Letters Patent is as follows:

1. A method of producing a smooth surface for a film of refractory metallic material comprising:

placing a substrate in a CVD reactor;

initiating deposition of a layer of two phase material via concurrent introduction into said CVD reactor of a precursor gas and molecular oxygen, the latter at a pressure between about $1\times10^{-6}$ and $1\times10^{-4}$ Torr;

annealing said layer at a temperature less than or equal to the deposition temperature, to transform said two phase material to a single phase to produce a film with substantially reduced surface roughness and altered grain structure.

2. A method of producing a smooth surface for a film of refractory metallic material comprising:

sputtering a refractory metal onto a substrate via the introduction of molecular oxygen at a pressure of between about $1\times10^{-6}$ and $1\times10^{-4}$ Torr to obtain a two-phase surface of refractory metal on said substrate;

annealing said layer at temperature in the range of 80° C. or above, to transform said two phase material to a single phase to produce a film with substantially reduced surface roughness and altered grain structure.

3. The method of producing a smooth surface for a film of refractory metallic material defined in claim 1 wherein said refractory material is selected from the group consisting of molybdenum, niobium, tantalum and tungsten.

4. The method of producing a smooth surface for a film of refractory metallic material defined in claim 1 wherein said refractory material is tungsten.

5. The method of producing a smooth surface for a film of refractory metallic material defined in claim 3 wherein said CVD precursor gas comprises tungsten hexacarbonyl.

6. The method of producing a smooth surface for a film of refractory metallic material defined in claim 1 wherein said substrate comprises silicon, silicon dioxide or silicon nitride.

7. The method of producing a smooth surface for a film of refractory metallic material defined in claim 3 wherein said substrate comprises silicon, silicon dioxide or silicon nitride.

8. The method of producing a smooth surface for a film of refractory metallic material defined in claim 4 wherein said substrate comprises silicon, silicon dioxide or silicon nitride.

9. The method of producing a smooth surface for a film of refractory metallic material defined in claim 2 wherein said refractory material is selected from the group consisting of molybdenum, niobium, tantalum and tungsten.

10. The method of producing a smooth surface for a film of refractory metallic material defined in claim 2 wherein said refractory material is tungsten.

11. The method of producing a smooth surface for a film of refractory metallic material defined in claim 2 wherein said substrate comprises silicon, silicon dioxide or silicon nitride.

12. The method of producing a smooth surface for a film of refractory metallic material defined in claim 10 wherein said substrate comprises silicon, silicon dioxide or silicon nitride.

13. The method of producing a smooth surface for a film of refractory metallic material defined in claim 1 wherein said deposition is accomplished at a temperature in the range of between about 200° C. and 600° C.

14. The method of producing a smooth surface for a film of refractory metallic material defined in claim 13 wherein said refractory material is tungsten; said substrate comprises silicon, silicon dioxide or silicon nitride; and said CVD precursor gas comprises tungsten hexacarbonyl.

\* \* \* \* \*